US011342524B2

(12) United States Patent
Ueta et al.

(10) Patent No.: US 11,342,524 B2
(45) Date of Patent: May 24, 2022

(54) LIGHT EMITTING ELEMENT, LIGHT EMITTING DEVICE, AND APPARATUS FOR PRODUCING LIGHT EMITTING ELEMENT

(71) Applicant: SHARP KABUSHIKI KAISHA, Sakai (JP)

(72) Inventors: Yoshihiro Ueta, Sakai (JP); Shinichi Handa, Sakai (JP); Noboru Iwata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 64 days.

(21) Appl. No.: 17/041,137

(22) PCT Filed: Mar. 30, 2018

(86) PCT No.: PCT/JP2018/013803

§ 371 (c)(1), (2) Date: Sep. 24, 2020

(87) PCT Pub. No.: WO2019/187064

PCT Pub. Date: Oct. 3, 2019

(65) Prior Publication Data

US 2021/0098729 A1 Apr. 1, 2021

(51) Int. Cl.
*H01L 51/50* (2006.01)

(52) U.S. Cl.
CPC ........ *H01L 51/502* (2013.01); *H01L 51/5064* (2013.01); *H01L 51/5072* (2013.01)

(58) Field of Classification Search
None
See application file for complete search history.

(56) References Cited

U.S. PATENT DOCUMENTS

2007/0103068 A1 5/2007 Bawendi et al.
2012/0238047 A1 9/2012 Bawendi et al.
2012/0292595 A1 11/2012 Bawendi et al.
2017/0125635 A1 5/2017 Bawendi et al.
2018/0254421 A1* 9/2018 Kinge ..................... H01L 51/56
2019/0097151 A1* 3/2019 Lee ..................... H01L 51/5092
2019/0157566 A1* 5/2019 Ryu ..................... C07D 495/04

FOREIGN PATENT DOCUMENTS

JP 2012-023388 A 2/2012
WO 2006/088877 A1 8/2006

* cited by examiner

*Primary Examiner* — Daniel Whalen
(74) *Attorney, Agent, or Firm* — ScienBiziP, P.C.

(57) ABSTRACT

A light-emitting element is provided to improve light emission efficiency of a light-emitting element. The light-emitting element includes: a first electrode; a second electrode; a quantum dot layer provided between the first electrode and the second electrode, in which quantum dots are layered; and a hole-transport layer provided between the quantum dot layer and the first electrode, wherein the hole-transport layer includes a plurality of layers each containing a different material, the plurality of layers of the hole-transport layer each have an ionization potential increasing from the first electrode toward the quantum dot layer, and, among the plurality of layers of the hole-transport layer, a layer in contact with the quantum dot layer is higher in ionization potential than the quantum dot layer.

20 Claims, 4 Drawing Sheets

(a)

(b)

LIGHT EMITTING ELEMENT, LIGHT EMITTING DEVICE, AND APPARATUS FOR PRODUCING LIGHT EMITTING ELEMENT

TECHNICAL FIELD

The present invention relates to a light-emitting element containing quantum dots, a light-emitting device including the light-emitting element, and an apparatus for producing the light-emitting element.

BACKGROUND ART

Patent Document 1 discloses a light-emitting device containing semiconductor nanocrystals.

CITATION LIST

Patent Literature

[Patent Document 1] Japanese Unexamined Patent Application Publication No. 2012-023388 (Published on Feb. 2, 2012)

SUMMARY OF INVENTION

Technical Problem

If quantum dots are higher in ionization potential than a hole-transport layer formed between an anode and a layer containing the quantum dots, efficiency in injection of the holes from the hole-transport layer to the quantum dots decreases. In order to solve the problem, the hole-transport layer would be made of a material with low ionization potential. In this case, however, efficiency in the hole injection from the anode to the hole-transport layer decreases. Hence, a typical technique is out of balance between the efficiency in transport of the holes from the hole-transport layer to a quantum dot layer and the efficiency in transport of electrons from an electron-transport layer to the quantum dot layer. This balancing problem leads to a decrease in light emission efficiency of a light-emitting element.

Solution to Problem

In order to solve the above problems, a light-emitting element of the present invention includes: a first electrode; a second electrode; a quantum dot layer provided between the first electrode and the second electrode, and including multilayer quantum dots; and a hole-transport layer provided between the quantum dot layer and the first electrode, wherein the hole-transport layer includes a plurality of layers each containing a different material, the layers of the hole-transport layer each have an ionization potential increasing from the first electrode toward the quantum dot layer, and, among the layers of the hole-transport layer, a layer in contact with the quantum dot layer is higher in ionization potential than the quantum dot layer.

Furthermore, in order to solve the above problems, an apparatus, of the present invention, for producing a light-emitting element includes a deposition unit configured to deposit: a first electrode; a second electrode; a quantum dot layer provided between the first electrode and the second electrode, and including multilayer quantum dots; and a hole-transport layer provided between the quantum dot layer and the first electrode, wherein the hole-transport layer includes a plurality of layers each containing a different material, the layers of the hole-transport layer each have an ionization potential increasing from the first electrode toward the quantum dot layer, and, among the layers of the hole-transport layer, a layer in contact with the quantum dot is higher in ionization potential than the quantum dot layer.

Advantageous Effects of Invention

The above features improves efficiency in transport of holes from a hole-transport layer to a quantum dot layer, making it possible to provide a light-emitting device whose light-emitting element increases in light emission efficiency.

DESCRIPTION OF EMBODIMENTS

First Embodiment

Figure 1:
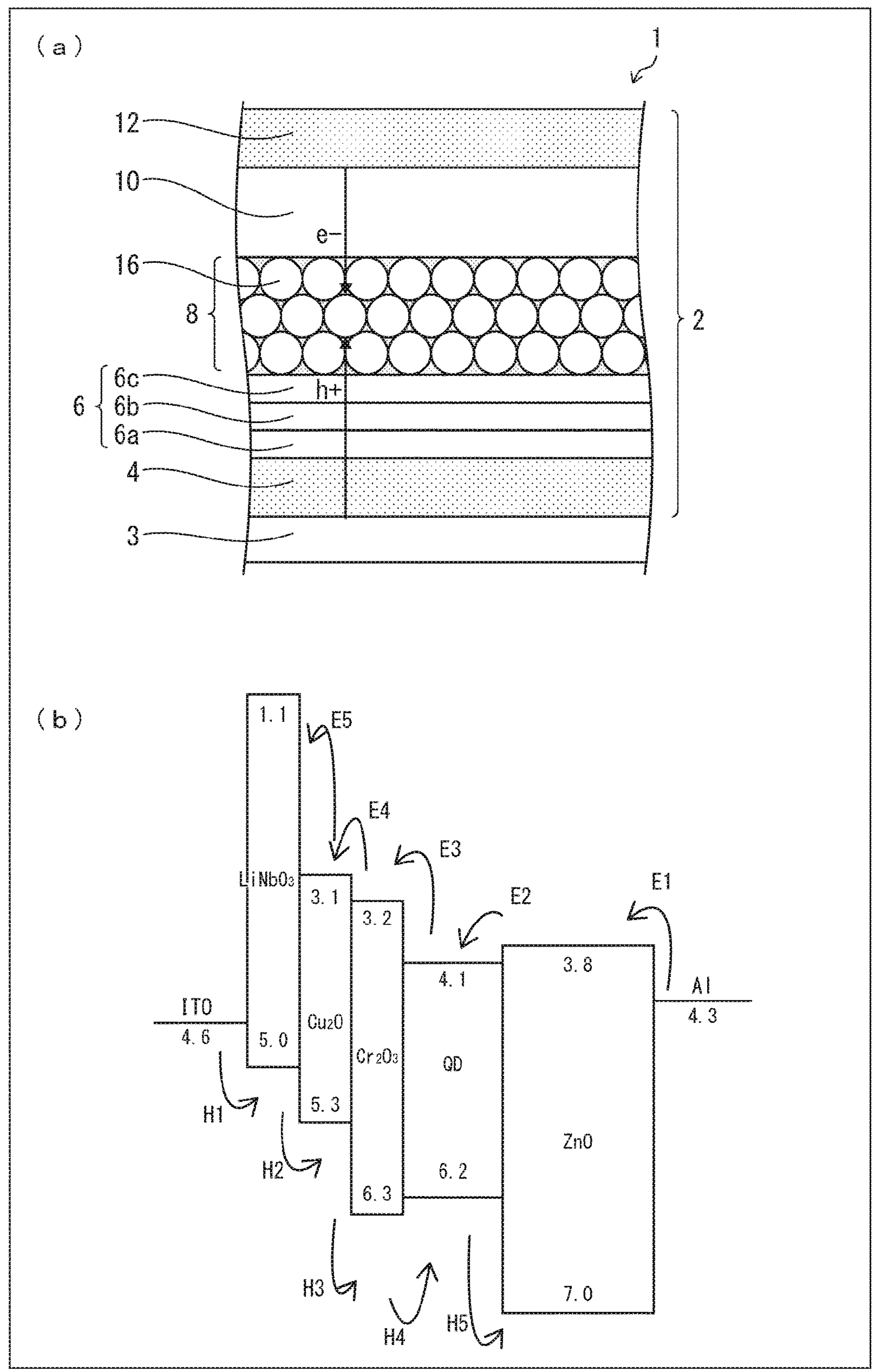
FIG. 1 illustrates a schematic cross-sectional view of a light-emitting device according to a first embodiment of the present invention, and an energy diagram showing a Fermi level of, or an electron affinity and an ionization potential of, each layer in a light-emitting element of the light-emitting device.

FIG. 1 shows in an illustration (a) a schematic cross-sectional view of a light-emitting device 1 according to this embodiment.

The illustration (a) in FIG. 1 shows that the light-emitting device 1 according to this embodiment includes: a light-emitting element 2; and an array substrate 3. The light-emitting device 1 is structured to include the array substrate 3 formed of not-shown thin-film transistors (TFTs), and the light-emitting element 2 multilayered and stacked on the array substrate 3. Note that, in DESCRIPTION, a direction from the light-emitting element 2 toward the array substrate 3 in the light-emitting device 1 is referred to as a "downward direction", and a direction from the array substrate 3 toward the light-emitting element 2 in the light-emitting device 1 is referred to as an "upward direction".

The light-emitting element 2 includes: a first electrode 4; a hole-transport layer 6; a quantum-dot layer 8; an electron-transport layer 10; and a second electrode 12 stacked on top of another in the stated order from below. The first electrode 4 included in the light-emitting element 2 formed above the array substrate 3 is electrically connected to the TFTs of the array substrate 3.

The first electrode 4 and the second electrode 12, containing a conductive material, are respectively and electrically connected to the hole-transport layer 6 and the electron-transport layer 10. In this embodiment, the first electrode 4 is an anode, and the second electrode 12 is a cathode.

Either the first electrode 4 or the second electrode 12 is a transparent electrode. The transparent electrode may be made of, for example, ITO, IZO, ZnO, AZO, or BZO, and formed by, for example, sputtering. Moreover, either the first electrode 4 or the second electrode 12 may contain a metallic material. The metallic material preferably includes such a substance as Al, Cu, Au, or Ag which is high in reflectance of visible light.

The quantum dot layer 8 includes quantum dots (semiconductor nanoparticles) 16 in the form of a single layer, or of two or more layers. In forming the quantum dot layer 8, the quantum dots 16 are dispersed in a solvent such as hexane or toluene so that a fluid disperse is produced. The fluid disperse is deposited by spin coating or an inkjet technique to form the quantum dot layer 8. Mixed with the fluid disperse may be a material in which such a substance as thiol or amine is dispersed. The quantum dot layer 8 preferably has a thickness ranging from 5 to 50 nm.

The quantum dots 16, including a valence band level and a conduction band level, is a light-emitting material emitting light by recombination of holes in the valence band level and electrons in the conduction band level. The light emitted from the quantum dots 16 has a narrow spectrum because of the quantum-size effect. Hence, the emitted light can be relatively high in chromaticity.

An example of the quantum dots 16 may be semiconductor nanoparticles in a core-shell structure whose core includes CdSe and shell includes ZnS. Other than that, the quantum dots 16 may also include, as the core-shell structure, CdSe/CdS, InP/ZnS, ZnSe/ZnS, or GIGS/ZnS.

The quantum dots 16 have a particle size approximately ranging from 3 to 15 nm. A wavelength of the light emitted from the quantum dots 16 can be controlled with the particle size of the quantum dots 16. Hence, through controlling the particle size of the quantum dot 16, the wavelength of the light emitted from the light-emitting device 1 can be controlled.

The hole-transport layer 6 transports the holes from the first electrode 4 to the quantum dot layer 8. In this embodiment, the hole-transport layer 6 includes a plurality of layers each containing a different material. As shown in the illustration (a) in FIG. 1, the hole-transport layer 6 includes: a first hole-transport layer 6*a*; a second hole-transport layer 6*b*; and a third hole-transport layer 6*c* stacked on top of another in the order closer to the first electrode 4. The first hole-transport layer 6*a* is in contact with the first electrode 4. The third hole-transport layer 6*c* is in contact with the quantum dot layer 8. Each of the layers in the hole-transport layer 6 may be deposited by sputtering. The hole-transport layer 6 preferably has a total thickness ranging from 5 to 40 nm.

In this embodiment, the first hole-transport layer 6*a* contains $LiNbO_3$, the second hole-transport layer 6*b* contains $Cu_2O$, and the third hole-transport layer 6*c* contains $Cr_2O_3$. In this embodiment, however, materials of the layers in the hole-transport layer 6 shall not be limited to the above ones. For example, the hole-transport layer 6 may be made of a metal oxide containing a transition metal such as Ni, Cr, Cu, W, Mo, and V, or may be made of an oxide of an alloy containing two or more of these transition metals as a composition. Alternatively, the hole-transport layer 6 may be a nitride of a group 3 element, and a nitride containing two or more of group 2 elements as a composition. Still alternatively, the hole-transport layer 6 may be a dielectric, a conductor, or a semiconductor including a compound ranging from groups 2 to 6 and having the perovskite structure. Moreover, the hole-transport layer 6 may include either only one of, or two or more of, the above inorganic materials.

Here, typical conductive organic compounds are significantly low in carrier mobility than common conductive inorganic materials such as metals and semiconductors. Hence, when a potential difference occurs, a space-charge layer appears in the hole-transport layer that consists only of a conductive organic compound. Thus, voltage-current characteristics of the hole-transport layer that consists only of a conductive organic compound do not exhibit ohmic characteristics so that a current is not proportional to voltage/layer thickness but to $voltage^2$/layer $thickness^3$. Alternately, the voltage-current characteristics exhibit space-charge-limited characteristics that are low in current value in relation to the ohmic characteristics. Hence, in a light-emitting element including the hole-transport layer that consists only of a conductive organic compound, a significantly large electric field needs to be applied to the hole-injection layer to drive the light-emitting element. Unfortunately, such a configuration is potentially vulnerable to electrostatic breakdown. Moreover, an organic compound deteriorates by oxidization. In order to ensure long-term dependability of a light-emitting element, the element needs to be tightly sealed at high costs for protection of the organic compound from oxygen or water in the atmosphere.

Meanwhile, in this embodiment, the hole-transport layer 6 contains an inorganic material. Hence, compared with a hole-transport layer that consists only of an organic material, the hole-transport layer 6 can improve carrier mobility. Moreover, inorganic materials are more resistant in oxidization and dependable than organic materials. Hence, the light-emitting element 2 according to this embodiment can reduce the risk of electrostatic breakdown and improve dependability.

The electron-transport layer 10 transports electrons from the second electrode 12 to the quantum dot layer 8. The electron-transport layer 10 may also function to block transportation of the holes. The electron-transport layer 10 may contain, for example, ZnO, $TiO_2$, $Ta_2O_3$, or $SrTiO_3$, and may be deposited by sputtering. The electron-transport layer 10 may have a typically known thickness, preferably ranging from 10 to 100 nm.

The hole-transport layer 6 and the electron-transport layer 10 may be each formed of nanoparticles, crystal, polycrystal, or amorphous. Furthermore, in order not to inhibit emission of light from the light-emitting element 2, the hole-transport layer 6 and the electron-transport layer 10 preferably have an absorption coefficient of $10\ cm^{-1}$ or smaller with respect to emission of light from the quantum dot layer 8.

The illustration (b) in FIG. 1 shows an energy diagram presenting an example of a Fermi level of, or an electron affinity and an ionization potential of, each layer in the light-emitting element 2 according to this embodiment. The illustration (b) in FIG. 1 shows from left to right the first electrode 4, the first hole-transport layer 6*a*, the second hole-transport layer 6*b*, the third hole-transport layer 6*c*, the quantum dot layer 8, the electron-transport layer 10, and the second electrode 12.

As to the first electrode 4 and the second electrode 12, a Fermi level of each electrode is represented in eV. In lower portions of the hole-transport layer 6, the quantum dot layer 8, and the electron-transport layer 10, an ionization potential of each layer is represented in eV with respect to vacuum level. In upper portions of the hole-transport layer 6, the quantum dot layer 8, and the electron-transport layer 10, an electron affinity of each layer is represented in eV with respect to vacuum level. Note that, as to the layers except the first electrode 4 and the second electrode 12, the Fermi level is omitted in the illustration (b) since the Fermi level is not directly involved in the electron transportation and the hole transportation.

In this DESCRIPTION, hereinafter, description of the ionization potential or the electron affinity alone is made with respect to vacuum level.

In this embodiment, as an example, the illustration (b) in FIG. 1 shows the case where the first electrode 4 is made of ITO, and the second electrode 12 is made of Al. In this case, the first electrode 4 has a Fermi level of 4.6 eV, and the second electrode 12 has a Fermi level of 4.3 eV.

In this embodiment, the hole-transport layer 6 includes: the hole-transport layer 6*a* containing $LiNbO_3$, the second hole-transport layer 6*b* containing $Cu_2O$, and the third hole-transport layer 6*c* containing $Cr_2O_3$. Here, the first hole-transport layer 6*a* has an ionization potential of 5.0 eV and an electron affinity of 1.1 eV. Moreover, the second hole-transport layer 6*b* has an ionization potential of 5.3 eV and an electron affinity of 3.1 eV. Furthermore, the third hole-transport layer 6*c* has an ionization potential of 6.3 eV and an electron affinity of 3.2 eV.

In this embodiment, as an example, the illustration (b) in FIG. 1 shows the case where the electron-transport layer 10 is made of ZnO. In this case, the electron-transport layer 10 has an ionization potential of 7.0 eV and an electron affinity of 3.8 eV. Moreover, in this embodiment, the quantum dot layer 8 has an ionization potential of, for example, 6.2 eV and an electron affinity of 4.1 eV even though the ionization potential and the electron affinity vary depending on the material and particle size of the quantum dots 16.

That is, the hole-transport layer 6 includes a plurality of layers each having an ionization potential increasing from the first electrode 4 toward the quantum dot layer 8. Moreover, among the layers of the hole-transport layer 6, the third hole-transport layer 6*c* in contact with the quantum dot layer 8 is higher in ionization potential than the quantum dot layer 8.

Furthermore, the hole-transport layer 6 includes the layers each having an electron affinity decreasing from the quantum dot layer 8 toward the first electrode 4. In addition, among the layers of the hole-transport layer 6, the third hole-transport layer 6*c* in contact with the quantum dot layer 8 is higher in electron affinity than the quantum dot layer 8.

Described below is how the light-emitting device 1 according to this embodiment emits light, with reference to FIG. 1.

In the light-emitting device 1, a potential difference is applied between the first electrode 4 and the second electrode 12, such that holes and electrons are respectively injected from the first electrode 4 and the second electrode 12 toward the quantum dot layer 8. As an arrow h+ indicates in the illustration (a) in FIG. 1, the holes from the first electrode 4 travel through the first hole-transport layer 6*a*, the second hole-transport layer 6*b*, and the third hole-transport layer 6*c* in the stated order, and reach the quantum dot layer 8. As an arrow e− indicates in the illustration (a) in FIG. 1, the electrons from the second electrode 12 travel through the electron-transport layer 10, and reach the quantum dot layer 8.

The holes and the electrons reaching the quantum dot layer 8 recombine in the quantum dots 16 and emit light. The light emitted from the quantum dots 16 may be reflected on the second electrode 12, which is, for example, a metal electrode. Then, the reflected light may pass through the first electrode 4, which is a transparent electrode, and the array substrate 3, and then be released out of the light-emitting device 1.

Described below is how the holes and the electrons are transported in the layers of the light-emitting element 2, with reference to the illustration (b) in FIG. 1.

In the light-emitting device 1, when the potential difference occurs between the first electrode 4 and the second electrode 12, the holes are injected from the first electrode 4 into the first hole-transport layer 6*a* as indicated by an arrow H1 in the illustration (b) in FIG. 1. In a similar manner, the electrons are injected from the second electrode 12 into the electron-transport layer 10 as indicated by an arrow E1 in the illustration (b) in FIG. 1.

The holes injected into the first hole-transport layer 6*a* are sequentially transported to the second hole-transport layer 6*b* and the third hole-transport layer 6*c* as indicated by arrows H2 and H3 in the illustration (b) in FIG. 1. Then, the holes are transported from the third hole-transport layer 6*c* to the quantum dot layer 8 as indicated by an arrow H4 in the illustration (b) in FIG. 1.

Here, for example, a barrier in transport of the holes from a first layer to a second layer different from the first layer is indicated by an energy obtained as a difference when the ionization potential of the first layer is subtracted from the ionization potential of the second layer. Furthermore, when the first layer is the first electrode 4, a barrier in transport of the holes from the first layer to the second layer is indicated by an energy obtained as a difference when the Fermi level of the first layer is subtracted from the ionization potential of the second layer.

Hence, in the illustration (b) in FIG. 1, the barriers in transport of the holes indicated by the arrows H1, H2, and H3 are 0.4 eV, 0.3 eV, and 1.0 eV. Moreover, the quantum dot layer 8 is lower in ionization potential than the third hole-transport layer 6*c*. Hence, no barrier is substantially observed in transport of the holes from the third hole-transport layer 6*c* to the quantum dot layer 8 as indicated by the arrow H4.

In a similar manner, the electrons are transported from the electron-transport layer 10 to the quantum dot layer 8 as indicated by an arrow E2 in the illustration (b) in FIG. 1. As can be seen, the holes and the electrons transported to the quantum dot layer 8 recombine in the quantum dots 16.

In the display device 1 according to this embodiment, the layers of the hole-transport layer 6 each have an ionization potential gradually increasing from the first electrode 4 toward the quantum dot layer 8. Hence, compared with a hole-transport layer in a single layer, the hole-transport layer 6 in multiple layers makes it possible to reduce a barrier in transport of the holes from the first electrode 4 to the hole-transport layer 6, and a barrier in transport of the holes inside the hole transport layer 6. Such a feature improves efficiency in transport of the holes from the first electrode 4 to the hole-transport layer 6.

Moreover, in the display device 1 according to this embodiment, the third hole-transport layer 6*c*, among the layers of the hole-transport layer 6 and in contact with the quantum dot layer 8, is higher in ionization potential than the quantum dot layer 8. This configuration makes it possible to reduce the barrier in transportation of the holes from the hole-transport layer 6 to the quantum dot layer 8. Such a feature improves efficiency in transport of the holes from the hole-transport layer 6 to the quantum dot layer 8.

Hence, the light-emitting element 2 according to this embodiment can improve efficiency in transport of the holes from the first electrode 4 to the quantum dot layer 8, and efficiently recombine the holes transported to the quantum dot layer 8 and the electrons transported from the second electrode 12 to the quantum dot layer 8. Thus, the light-emitting element 2 according to this embodiment can improve light emission efficiency of the quantum dot layer 8.

Note that, in the light-emitting element 2 of this embodiment, the difference between the Fermi level of the first electrode 4 and the ionization potential of the first hole-transport layer 6*a* is 1 eV or below. Moreover, the difference between the ionization potentials of any neighboring two layers among the first hole-transport layer 6*a*, the second hole-transport layer 6*b*, the third hole-transport layer 6*c*, and the quantum dot layer 8 is 1 eV or below.

Hence, in the light-emitting element 2 of this embodiment, the difference between the ionization potentials or between the Fermi level and the ionization potential of neighboring two of the layers arranged between the first electrode 4 and the quantum dot layer 8 is 1 eV or below. Such a feature further improves efficiency in transport of the holes from the first electrode 4 to the quantum dot layer 8.

In particular, between any neighboring two of the layers of the hole-transport layer 6, the barrier for transport of the holes in the direction from the first electrode 4 toward the quantum dot layer 8 is 1 eV or below. Such a feature further makes it possible to further reduce the barrier for transport of the holes, injected from the first electrode 4 into the hole-transport layer 6, to the quantum dot layer 8.

Furthermore, as indicated by an arrow H5 in the illustration (b) in FIG. 1, the barrier for transport of the holes from the quantum dot layer 8 to the electron-transport layer 10 is 0.8 eV, which is relatively large. In particular, the electron-transport layer 10 is higher in ionization potential than the quantum dot layer 8 by 0.6 eV or above. Hence, in the light-emitting element 2, the recombination of the holes and the electrons in the quantum dot layer 8 occurs more efficiently than the transportation of the holes from the quantum dot layer 8 to the electron-transport layer 10.

Moreover, in this embodiment, the quantum dot layer 8 is lower in ionization potential than the third hole-transport layer 6*c* and the electron-transport layer 10 both in contact with the quantum dot layer 8. Hence, between the third hole-transport layer 6*c* and the electron-transport layer 10, a well potential of the holes can be formed with the quantum dot layer 8 as a bottom. Such a feature can further improve efficiency in recombination of the holes and the electrons transported to the quantum dot layer 8 more greatly than in transportation of the holes to the hole-transport layer 6 or the electron-transport layer 10.

Here, for example, a barrier in transport of the electrons from a first layer to a second layer different from the first layer is indicated by an energy obtained as a difference when the electron affinity of the second layer is subtracted from the electron affinity of the first layer. Hence, in the illustration (b) in FIG. 1, the barriers in transport of the electrons indicated by arrows E3, E4, and E5 are 0.9 eV, 0.1 eV, and 2.0 eV. Moreover, the total of the barriers for transport of the electrons indicated by the arrows E3, E4, and E5 is 3.0 eV.

Hence, the hole-transport layer 6 includes the layers each having an electron affinity decreasing from the quantum dot layer 8 toward the first electrode 4. In addition, among the layers of the hole-transport layer 6, the third hole-transport layer 6*c* in contact with the quantum dot layer 8 is higher in electron affinity than the quantum dot layer 8. Such a feature makes it possible to efficiently reduce the chance of the electrons to be transported from the quantum dot layer 8 to the hole-transport layer 6, and to further improve efficiency in recombination of the holes and the electrons in the quantum dot layer 8.

In addition, at least one of the layers of the hole-transport layer 6 is lower in electron affinity than the quantum dot layer 8 by 1 eV or below. Such a feature makes it possible to efficiently reduce the chance of the electrons, transported to the quantum dot layer 8, to be transported through the hole-transport layer 6 to the first electrode 4, and to reduce more efficiently the risk of short circuit between the first electrode 4 and the second electrode 12.

Furthermore, in this embodiment, the quantum dot layer 8 is higher in electron affinity than the third hole-transport layer 6*c* and the electron-transport layer 10 both in contact with the quantum dot layer 8. Hence, between the third hole-transport layer 6*c* and the electron-transport layer 10, a well potential of the electrons can be formed with the quantum dot layer 8 as a bottom. Such a feature can further improve efficiency in recombination of the electrons and the holes transported to the quantum dot layer 8 more greatly than in transportation of the electrons to the hole-transport layer 6 or the electron-transport layer 10.

In the hole-transport layer 6 of this embodiment, any of the first hole-transport layer 6*a* to the third hole-transport layer 6*c* has a band gap of 4.0 eV or below. Typically, a wide gap material whose band gap exceeds 4 eV requires larger energy for activating the holes than thermal energy at room temperature, thereby posing difficulty in increasing hole concentration. Furthermore, typically, the above wide gap material is known to exhibit a phenomenon in which, even if a high concentration of accepter impurity is added to the wide gap material, the holes are compensated for the electrons naturally generated to have approximately the same concentration as that of the accepter impurity, thereby also posing difficulty in increasing hole concentration. Thus, this embodiment makes it possible to further increase the hole concentration of the hole-transport layer 6.

Note that, as a modification of this embodiment, the hole-transport layer 6*a* may be deficient in Li. In sputtering to deposit the hole-transport layer 6*a*, the hole-transport layer 6*a* deficient in Li may be formed by a spurring apparatus operating on, for example, doubled electric power or larger. Other than that, in sputtering to deposit the first hole-transport layer 6*a*, the first hole-transport layer 6*a* may be formed deficient in Li, utilizing reactive sputtering to excessively supply oxygen, or using a target material whose Li composition is previously decreased below its stoichiometric composition.

When the first hole-transport layer 6*a* is deficient in Li, the first hole-transport layer 6*a* containing $LiNbO_3$ becomes a p-type one. Hence, the ionization potential of the p-type first hole-transport layer 6*a* becomes lower to be closer to the Fermi level of the first electrode 4. Such a feature further improves efficiency in transport of the holes from the first electrode 4 to the first hole-transport layer 6*a*.

Figure 2:
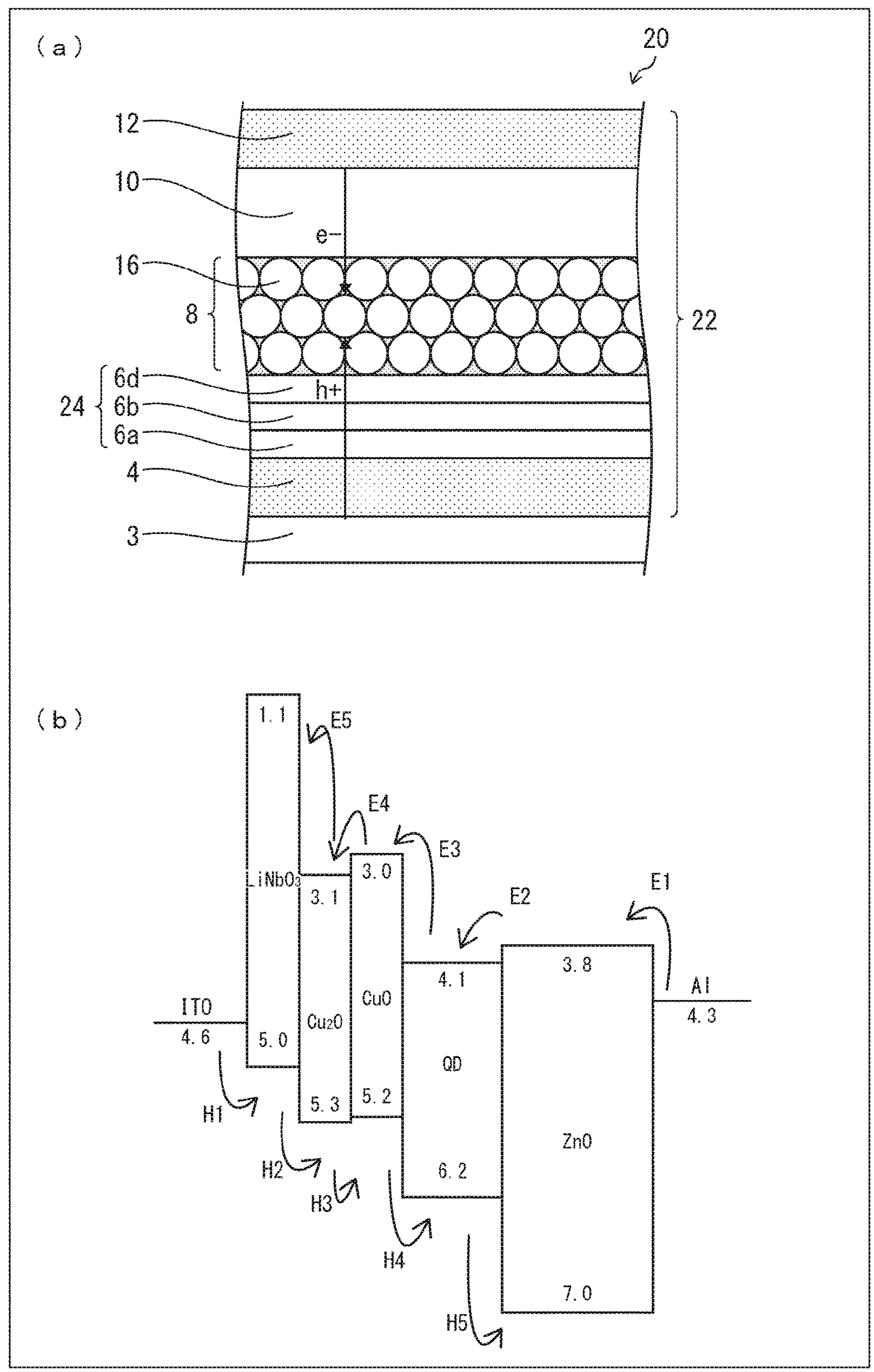
FIG. 2 illustrates a schematic cross-sectional view of a light-emitting device according to a comparative example, and an energy diagram showing an example of a Fermi level of, or an electron affinity and an ionization potential of, each layer in a light-emitting element of the light-emitting device.

FIG. 2 illustrates a schematic cross-sectional view of a light-emitting device 20 according to a comparative example, and an energy diagram showing an example of a Fermi level of, or an electron affinity and an ionization potential of, each layer in a light-emitting element 22 of the light-emitting device 20. The light-emitting device 20 according to the comparative example includes the light-emitting element 22. Compared the light-emitting element 22 with the light-emitting element 2 according to this embodiment, the only difference therebetween is that the light-emitting element 22 includes a hole-transport layer 24 containing a third hole-transport layer 6*d* made of CuO.

The light-emitting device 20 emits light by the same principle as that described in this embodiment. Here, the barrier in transport of the holes from the third hole-transport layer 6*d* to the quantum dot layer 8 is 1.0 eV. The light-emitting element 22 according to the comparative example fails to have a configuration in which the ionization potential gradually increases from the first electrode 4 toward the quantum dot layer 8. In the light-emitting element 22, in particular, the ionization potential of the third hole-transport layer 6*d* is lower than that of the second hole-transport layer 6*b* by 0.1 eV. Compared the light-emitting element 22 with the light-emitting element 2, the barrier becomes larger in transport of the holes from the third hole-transport layer 6*d* to the quantum dot layer 8. Hence, compared with the light-emitting element 2, the light-emitting element 22 fails to efficiently transport the holes from the first electrode 4 to the quantum dot layer 8.

Figure 3:
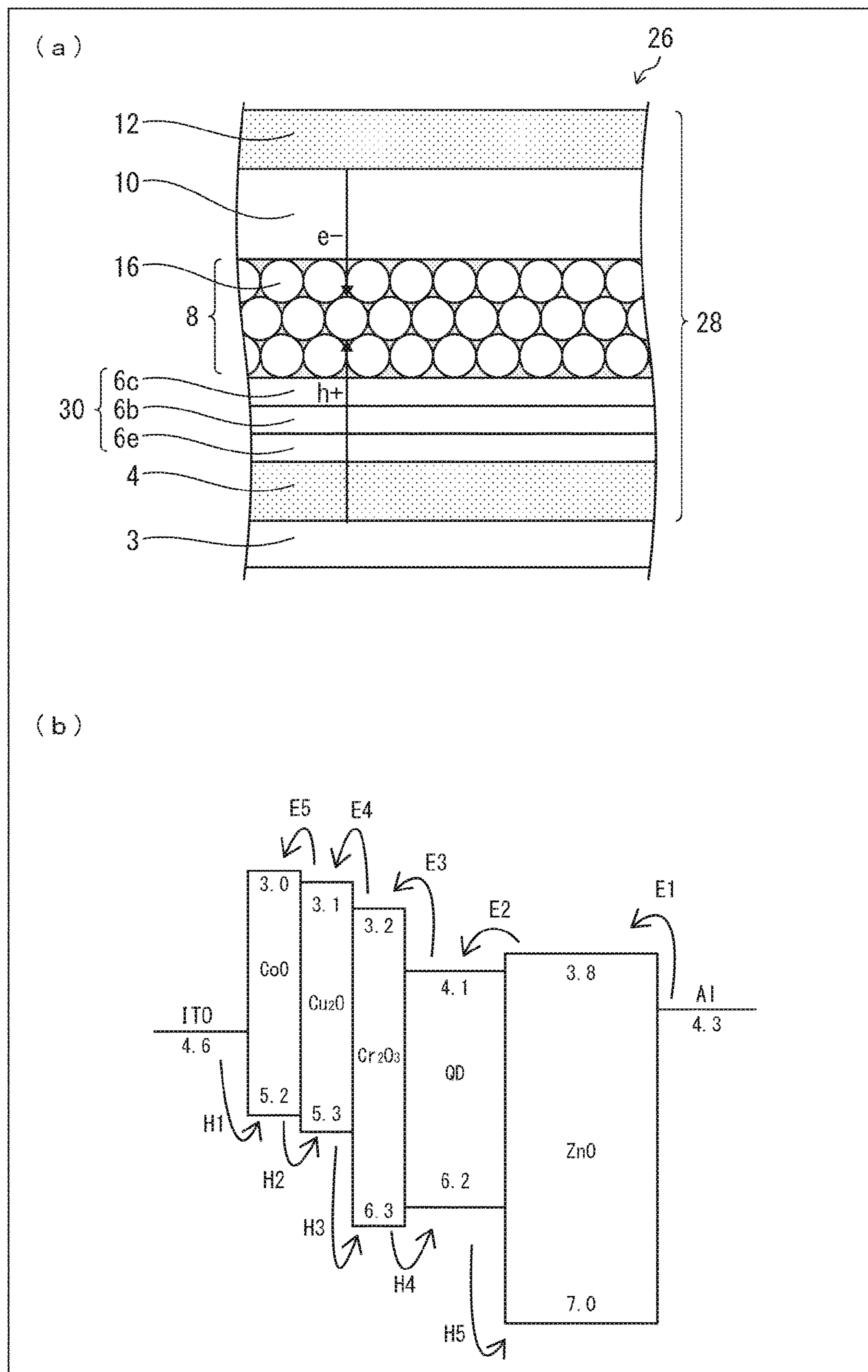
FIG. 3 illustrates a schematic cross-sectional view of a light-emitting device according to another comparative example, and an energy diagram showing an example of a Fermi level of, or an electron affinity and an ionization potential of, each layer in a light-emitting element of the light-emitting device.

FIG. 3 illustrates a schematic cross-sectional view of a light-emitting device 26 according to another comparative example, and an energy diagram showing an example of a Fermi level of, or an electron affinity and an ionization potential of, each layer in a light-emitting element 28 of the light-emitting device 26. The light-emitting device 26 according to the other comparative example includes the light-emitting element 28. Compared the light-emitting element 28 with the light-emitting element 2 according to this embodiment, the only difference therebetween is that the light-emitting element 28 includes a hole-transport layer 30 containing a first hole-transport layer 6*e* made of CoO.

The light-emitting device 26 emits light by the same principle as that described in this embodiment. Here, the barrier in transport of the electrons from the second hole-transport layer 6*b* to the first hole-transport layer 6*e* is 0.1 eV. Hence, compared with the light-emitting element 2, the light-emitting element 28 fails to efficiently reduce the risk of short circuit between the first electrode 4 and the second electrode 12.

Figure 4:
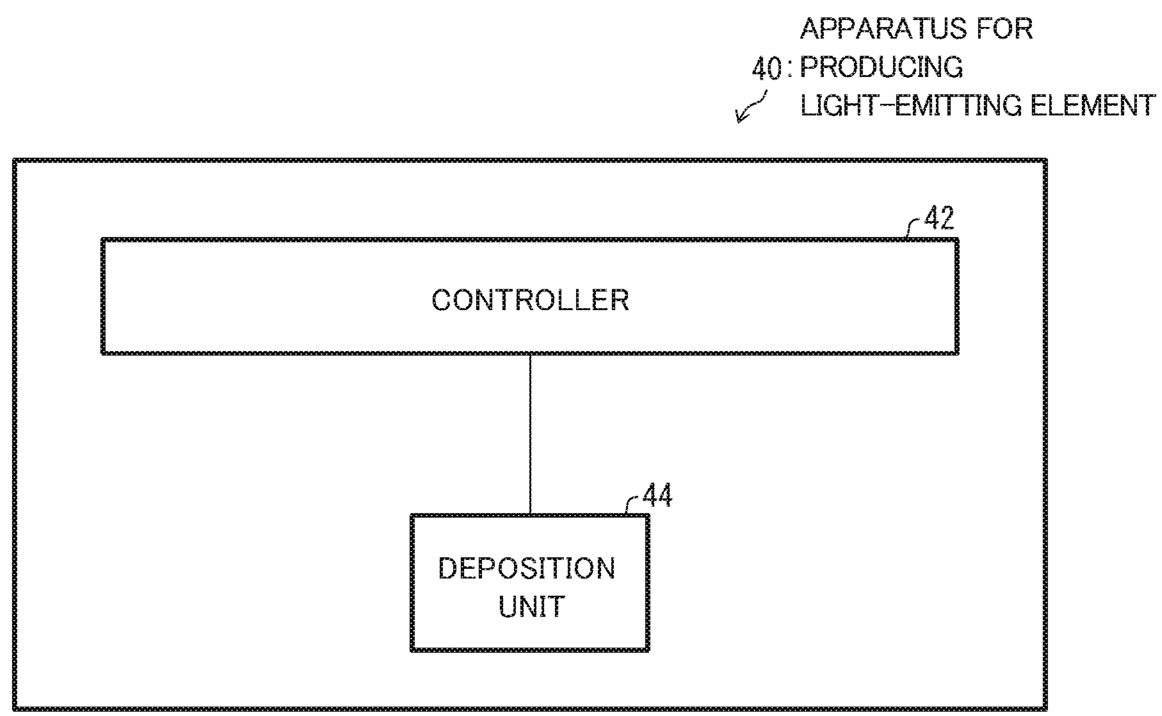
FIG. 4 is a block diagram illustrating an apparatus for producing a light-emitting element according to the embodiments of the present invention.

FIG. 4 is a block diagram illustrating an apparatus 40 for producing a light-emitting element according to each of the embodiments. The apparatus 40 for producing the light-emitting element includes: a controller 42; and a deposition unit 44. The controller 42 controls the deposition unit 44. The deposition unit 44 deposits the layers of the light-emitting element 2.

SUMMARY

A light-emitting element according to a first aspect includes: a first electrode; a second electrode; a quantum dot layer provided between the first electrode and the second electrode, and including multilayer quantum dots; and a hole-transport layer provided between the quantum dot layer and the first electrode, wherein the hole-transport layer includes a plurality of layers each containing a different material, the layers of the hole-transport layer each have an ionization potential increasing from the first electrode toward the quantum dot layer, and, among the layers of the hole-transport layer, a layer in contact with the quantum dot layer is higher in ionization potential than the quantum dot layer.

In a second aspect, between neighboring two of the layers of the hole-transport layer, a barrier for transport of holes in a direction from the first electrode toward the quantum dot layer is 1 eV or below.

In a third aspect, at least one of the layers of the hole-transport layer is lower in electron affinity than the quantum dot layer by 1 eV or below.

In a fourth aspect, the hole-transport layer includes at least one inorganic material including (i) a metal oxide containing transition metals such as Ni, Cr, Cu, W, Mo, and V, (ii) an oxide of an alloy containing two or more of the transition metals as a composition, (iii) a nitride of a group 3 element, and a nitride containing two or more of group 2 elements as a composition, or (iv) a dielectric, a conductor, or a semiconductor including a compound ranging from groups 2 to 6 and having a perovskite structure.

In a fifth aspect, the hole-transport layer includes at least two or more of inorganic materials included in the at least one inorganic material.

In a sixth aspect, the layers in the hole-transport layer each have a band gap of 4.0 eV or below.

In a seventh aspect, the hole-transport layer has an absorption coefficient of 10 $cm^{-1}$ or smaller with respect to emission of light from the quantum dot layer.

In an eight aspect, the hole-transport layer is made of crystal, polycrystalline, or amorphous.

In a ninth aspect, the light-emitting element further includes an electron-transport layer provided between the quantum dot layer and the second electrode, wherein the electron-transport layer is higher in ionization potential than the quantum dot layer.

In a tenth aspect, the electron-transport layer is higher in ionization potential than the quantum dot layer by 0.6 eV or above.

In an eleventh aspect, the electron-transport layer has an absorption coefficient of 10 $cm^{-1}$ or smaller with respect to the emission of the light from the quantum dot layer.

In twelfth aspect, the electron-transport layer is made of crystal, polycrystalline, or amorphous.

A light-emitting device according to a thirteenth aspect includes the light-emitting element according to any one of the above aspects.

An apparatus for producing a light-emitting element according to a fourteenth aspect includes a deposition unit configured to deposit: a first electrode; a second electrode; a quantum dot layer provided between the first electrode and the second electrode, and including multilayer quantum dots; and a hole-transport layer provided between the quantum dot layer and the first electrode, wherein the hole-transport layer includes a plurality of layers each containing a different material, the layers of the hole-transport layer each have an ionization potential increasing from the first electrode toward the quantum dot layer, and, among the layers of the hole-transport layer, a layer in contact with the quantum dot is higher in ionization potential than the quantum dot layer.

The present invention shall not be limited to the embodiments described above, and can be modified in various manners within the scope of claims. The technical aspects disclosed in different embodiments are to be appropriately combined together to implement another embodiment. Such an embodiment shall be included within the technical scope of the present invention. Moreover, the technical aspects disclosed in each embodiment are combined to achieve a new technical feature.

REFERENCE SIGNS LIST

1 Light-Emitting Device
2 Light-Emitting Element
4 First Electrode
6 Hole-Transport Layer
8 Quantum Dot Layer
12 Second Electrode
16 Quantum Dot
40 Apparatus for Producing Light-Emitting Element

The invention claimed is:

1. A light-emitting element, comprising:

a first electrode; a second electrode; a quantum dot layer provided between the first electrode and the second electrode, in which quantum dots are layered; and a hole-transport layer provided between the quantum dot layer and the first electrode, wherein the hole-transport layer includes a plurality of layers each containing a different material, the plurality of layers of the hole-transport layer each have an ionization potential increasing from the first electrode toward the quantum dot layer, and among the plurality of layers of the hole-transport layer, a layer in contact with the quantum dot layer is higher in ionization potential than the quantum dot layer.

2. A light-emitting element, comprising:

a quantum dot layer provided between a first electrode and a second electrode and including quantum dots; and a hole-transport layer provided between the quantum dot layer and the first electrode, wherein the hole-transport layer includes a plurality of layers each containing a different material or a different composition, and includes at least one kind among inorganic materials each including (i) a metal oxide containing transition metals including Ni, Cr, Cu, W, Mo, and V, (ii) an oxide of an alloy containing two or more of the transition metals as a composition, (iii) a nitride of a group 3 element, and a nitride containing two or more of group 2 elements as a composition, or (iv) a dielectric, a conductor, or a semiconductor including group 2 to 6 compound and having a perovskite structure, and among the plurality of layers, a layer in contact with the quantum dot layer is higher in ionization potential than the quantum dot layer.

3. The light-emitting element according to claim 2, wherein between neighboring two of the layers of the hole-transport layer, a hole transport barrier in a direction from the first electrode toward the quantum dot layer is 1 eV or below.

4. The light-emitting element according to claim 2, wherein at least one layer of the hole-transport layer is lower in electron affinity than the quantum dot layer by 1 eV or above.

5. The light-emitting element according to claim 2, wherein the hole-transport layer includes a combination of at least two or more kinds among the inorganic materials.

6. The light-emitting element according to claim 2, wherein the layers in the hole-transport layer each have a band gap of 4.0 eV or below.

7. The light-emitting element according to claim 2, wherein the hole-transport layer has an absorption coefficient of 10 $cm^{-1}$ or smaller with respect to emission of light from the quantum dot layer.

8. The light-emitting element according to claim 2, wherein the hole-transport layer is made of crystal, polycrystalline, or amorphous.

9. The light-emitting element according to claim 2, further comprising an electron-transport layer provided between the quantum dot layer and the second electrode, wherein the electron-transport layer is higher in ionization potential than the quantum dot layer.

10. The light-emitting element according to claim 9, wherein the electron-transport layer is higher in ionization potential than the quantum dot layer by 0.6 eV or above.

11. The light-emitting element according to claim 9, wherein the electron-transport layer has an absorption coefficient of 10 $cm^{-1}$ or smaller with respect to emission of light from the quantum dot layer.

12. The light-emitting element according claim 9, wherein the electron-transport layer is made of crystal, polycrystalline, or amorphous.

13. A light-emitting device comprising the light-emitting element according to claim 2.

14. An apparatus for producing a light-emitting element according to claim 2.

15. A light emitting element, comprising:

a quantum dot layer provided between a first electrode and a second electrode and including quantum dots including (i) a compound containing a combination of Cd, Zn, or In and Se, S, or P, or (ii) a compound containing a combination of Cu, In, Ga, and Se; and a hole-transport layer provided between the quantum dot layer and the first electrode, wherein the hole-transport layer includes a plurality of layers each containing a different material or a different composition, and includes at least one kind among inorganic materials each including (i) a metal oxide containing transition metals including Ni, Cr, Cu, W, Mo, and V, (ii) an oxide of an alloy containing two or more of the transition metals as a composition, (iii) a nitride of a group 3 element, and a nitride containing two or more of group 2 elements as a composition, or (iv) a dielectric, a conductor, or a semiconductor including group 2 to 6 compound and having a perovskite structure, and among the plurality of layers, a layer in contact with the quantum dot layer contains $Cr_2O_3$.

16. The light-emitting element according to claim 15, wherein the hole-transport layer includes a combination of at least two or more kinds of among the inorganic materials.

17. The light-emitting element according to claim 15, wherein the hole-transport layer has an absorption coefficient of 10 $cm^{-1}$ or smaller with respect to emission of light from the quantum dot layer.

18. The light-emitting element according to claim 15, wherein the hole-transport layer is made of crystal, polycrystalline, or amorphous.

19. The light-emitting element according to claim 15, further comprising an electron-transport layer provided between the quantum dot layer and the second electrode, wherein the electron-transport layer has an absorption coefficient of 10 $cm^{-1}$ or smaller with respect to emission of light from the quantum dot layer.

20. The light-emitting element according to claim 15, further comprising an electron-transport layer provided between the quantum dot layer and the second electrode, wherein the electron-transport layer is made of crystal, polycrystalline, or amorphous.

* * * * *